United States Patent [19]

Diamond

[11] 4,371,762
[45] Feb. 1, 1983

[54] CONTACTLESS PRESSURE SENSITIVE SWITCH

[75] Inventor: John A. Diamond, Glenview, Ill.

[73] Assignee: Vapor Corporation, Chicago, Ill.

[21] Appl. No.: 60,924

[22] Filed: Jul. 26, 1979

[51] Int. Cl.³ .................... H01H 3/16; H01H 9/00; E05F 15/02

[52] U.S. Cl. .................................. 200/61.43; 335/1; 338/42

[58] Field of Search ............ 200/61.43, 61.25, 83 L, 200/83 R, 83 S, 83 SA, 83 N, 86 R; 49/27, 28; 335/205, 206, 207, 215, 1, 3; 338/32 R, 32 H, 42; 73/DIG. 2, 722, 728; 336/110; 365/62, 86, 133, 137

[56] References Cited

U.S. PATENT DOCUMENTS 3,843,855 10/1974 Danielson .................. 200/83 T

Primary Examiner—J. R. Scott
Attorney, Agent, or Firm—Francis J. Lidd

[57] ABSTRACT

A contactless pressure switch 10 sensitive to fluid pressure rates of change includes a housing 36 and a diaphragm 42 secured in the housing defining first and second chambers. Ports 48, 50 are included in the first and second chambers to vent the chambers. A magnet 52 is secured to the diaphragm and a switching module 54 is secured to the housing within one of the first or second chambers at a position spaced from the diaphragm. A biasing magnet 53 is mounted with the module to provide symmetrical switching by the module. The other of the first or second chambers is coupled to a sensing tube 28 such that upon a pulse or rate change of pressure being introduced in the other of first and second chambers, the diaphragm is deflected. This moves the magnet 52 toward the module actuating it to switch the module and actuate a desired circuit. In an alternative embodiment, the position of the module may be varied relative to the diaphragm to vary the sensitivity of the switch.

8 Claims, 4 Drawing Figures 4,371,762

CONTACTLESS PRESSURE SENSITIVE SWITCH

BACKGROUND OF THE INVENTION

A. Field of the Invention

The device of the present invention relates to a new and improved contactless pressure switch that is sensitive to fluid pressure rates of change.

B. Description of the Prior Art

Pressure control switches whether employed in closed systems or systems in communication with the atmosphere typically employ contacts, which over the normal operating life become contaminated or deteriorate due to the atmosphere to which they are exposed thereby requiring costly replacement or repair. Pressure switches used in sensitive edges or doors for transit vehicles such as the type illustrated and described in U.S. Pat. No. 4,133,365 utilize electric contacts as indicated above, along with an additional modification of a switch diaphragm rendering this switch rate sensitive, or responsive to pneumatic pressure waves or pulses. Prior art pressure sensitive switches are actuated by continuous pressure and only remain engaged as long as the pressure is maintained.

The prior art switches discussed above are unsatisfactory due to unreliable contact operation.

SUMMARY OF THE INVENTION

An object of the present invention is to provide a new and improved contactless pressure switch sensitive to fluid pressure rates of change.

Another object of the present invention is to provide a new and improved pressure sensitive switch that does not employ electrical contacts.

A further object of the present invention is to provide a new and improved pressure actuated switch that includes only one moving part and needs no electrical power.

An additional object of the present invention is to provide a new and improved pressure switch that has a high resistance to contamination.

The present invention is directed to a new and improved contactless pressure switch that is sensitive to fluid pressure rates of change. The switch includes a housing with a diaphragm mounted therein dividing the housing into two chambers. Each chamber is ported to atmosphere, with the first or upper chamber having a connection to a source of fluid pressure that actuates or causes the diaphragm to flex within the housing. A magnet is mounted on the diaphragm and a switching module that is preferably a Weigand module utilizing a Wiegand wire and associated pick up coil is secured in the second chamber. A biasing magnet may be mounted on or adjacent the module to provide symmetrical switching.

The module includes electrical terminals that are connected to a circuit that in the preferred embodiment provides a signal which actuates the doors of a transit vehicle.

In an alternative embodiment of the present invention, the switch module is mounted on a screw or similar device that provides variation in the position of the module relative to the magnet on the diaphragm thus varying the sensitivity of the switch.

BRIEF DESCRIPTION OF THE DRAWING

The above and other objects and advantages and novel features of the present invention will become apparent from the following detailed description of preferred embodiments of the invention illustrated in the accompanying drawing wherein.

DESCRIPTION OF THE PREFERRED EMBODIMENT

Figure 1:
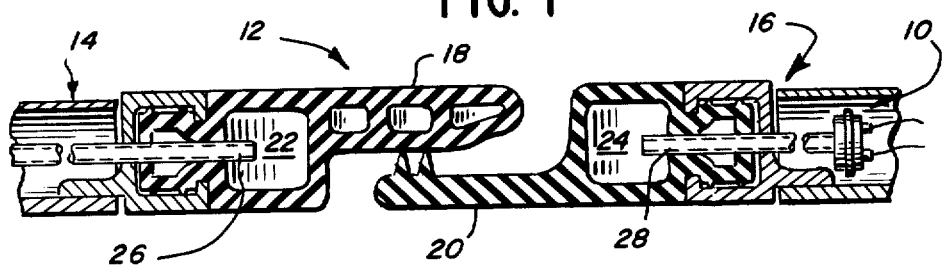
FIG. 1 is a cross-sectional view of a sensing edge of a door of a transit vehicle or similar device that includes a switch constructed in accordance with the principles of the present invention.

Having reference to the drawings, the present invention is directed to a contactless pressure switch generally designated by the reference numeral 10 that is sensitive to fluid pressure rates of change. The switch 10 of the present invention may be employed in a number of pressure actuated devices. As those skilled in the art will readily understand, a pressure switch similar to that disclosed in this application without the orifice 48, provides a pressure sensitive switch responsive to steady state positive or negative pressures having the advantages of contactless operation. The preferred embodiment is illustrated as being employed in a bifolding door employing an obstruction sensing edge such as the type disclosed in U.S. Pat. No. 4,133,365, incorporated by reference herein. Although other door configurations such as sliding, plug, or guillotine will benefit from the application of the invention disclosed herein. Since the bifolding doors generally designated by reference numeral 12 are more completely described in the above-noted patent, they will only briefly be described here.

The bifolding doors 12 are the type that may be used in rear door of transit vehicles and include first 14 and second 16 door sections that have mounted on the leading edge thereof obstruction sensing edges 18 and 20. The obstruction sensing edges 18 and 20 are made from a flexible elastomeric material and define interior fluid chamber 22 and 24, respectively, that are completely enclosed except for sensing tubes 26 and 28, respectively. The sensing tubes 26 and 28 are in fluid communication with switches 10. Only one switch is illustrated in FIG. 1, however, as will be understood by one skilled in the art, a similar switch 10 is also connected to the sensing tube 26. In the preferred embodiment the chambers 22 and 24 are filled with fluid such as air. Although the switch 10 is disclosed as located in a cavity of the door 16, in many instances the switch would be housed in a stationary portion of the door support structure adjacent to the door and pressure signals would be communicated to the switch via a tube similar to the sensing tube 26 disclosed, however, it would be arranged to flexibly adjust to the door travel.

Figure 2:
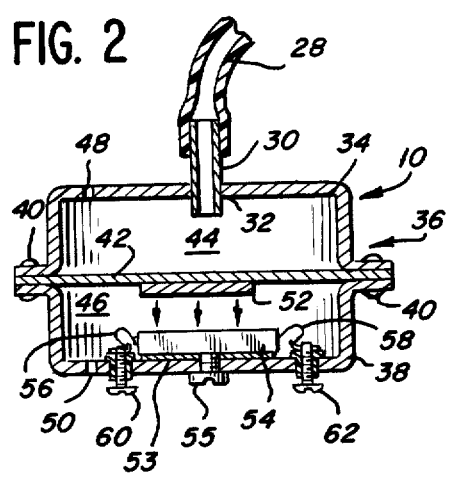
FIG. 2 is an enlarged cross-sectional view of the switch of the present invention.
Figure 3:
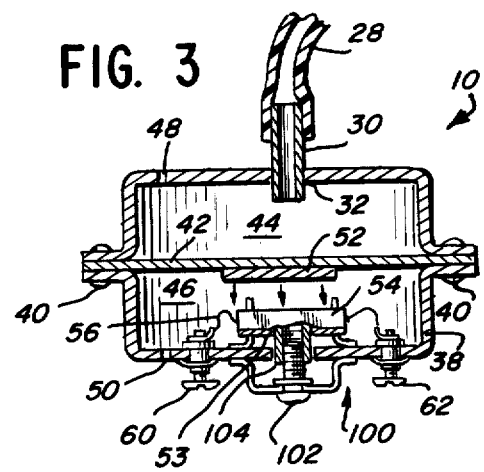
FIG. 3 is a vertical cross-sectional view of an alternative embodiment of the switch of the present invention.
Figure 4:
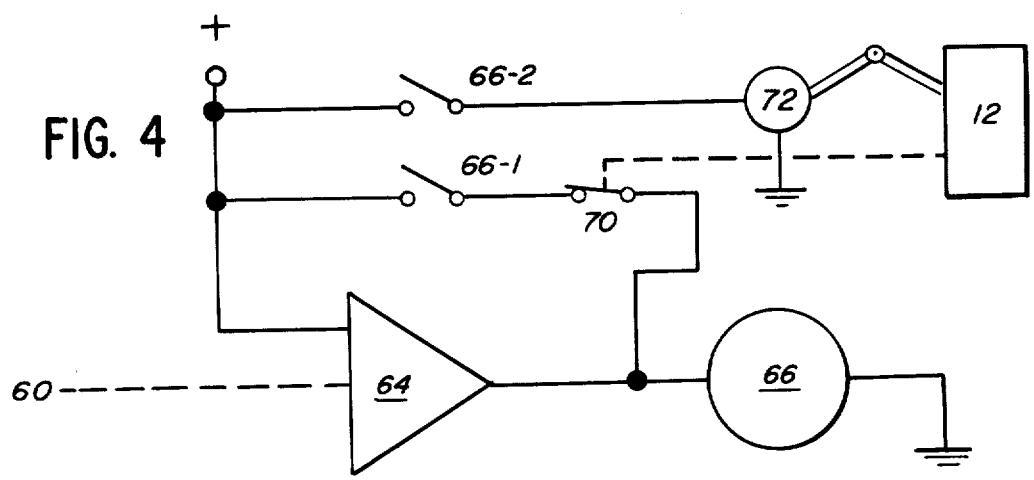
FIG. 4 is a schematic illustration of a circuit to which the switch of the present invention may be coupled.

The sensing tube 28 is coupled to a coupling tube 30 (FIG. 2) in the switch 10 that extends through an aperture 32 defined in the upper portion 34 of the housing 36. The housing 36 of the switch 10 is defined by upper 34 and lower 38 housing portions coupled together by fasteners 40 such as rivets or the like. Sandwiched between the upper 34 and the lower 38 housing portions is an elastomeric diaphragm 42 that divides the housing 36 into a first 44 and second 46 fluid chambers each of orted to the atmosphere through ports 48 )ectively. A magnet 52 is secured to the 12 and in the preferred embodiment is a :net although an alloy magnet may be used sired. An additional and equally functional provided by utilizing the diaphragm con- magnetic material, in which case an exter- net will not be necessary.

om the magnet and secured to the lower 'ion 38 is a switch module 54 that in the ibodiment is of the Wiegand module type. 54 is secured to the lower housing portion ner 55 and is connected by leads 56 and 58 60 and 62, respectively. A biasing magnet ıy be of a smaller and opposite field of the mounted to the module 54 to provide sym- tching. The magnet 53 can be excluded or 'er field than magnet 52 depending on the :hing desired.

nal 60, for example, in the preferred em- ay be coupled to an amplifier 64 (FIG. 4) s connected to a relay coil 66. A normally ı of relay 66 that includes contact 66-1 and cted through switch 70 to provide a circuit coil 66. On a pulse from terminal 60 the will energize coil 66 closing contact 66-1 to ıy energized. Contact 66-1 supplies power ator motor 72 to drive the door 12 open. or is open, switch 70 is opened by the door gizing relay coil 66 thereby stopping the 'oor control circuitry is arranged to auto- :lose the door.

t forth the structure of the switch 10, its ill be described. If an individual were de- a transit vehicle and the door 12 closed on ıl or engaged a package that the individual , the sensing edges 18 and 20 would engage or individual and deform causing a defor- e chambers 22 and 24. A pulse or rate of luid pressure is then transmitted to the his change in the rate of pressure is sensed hragm 42 causing it to dispend or move witch module 54. As this occurs, the mag- ved closer to the switching module 54 and eristic of the Wiegand module, as the mag- )proaches the module, the flux causes the vitch inducing a voltage pulse in the sensing odule sending this pulse to the amplifier 64. in the door 12 cycling to the open position individual to depart from the doors with- ırmed. As the diaphragm 42 returns to its ıtion, the field of the biasing magnet 53 e module 54 driving it back to its original the output of the Wiegand module or coil is tuating an amplifier or similar device, in ıg a relay, those skilled in the art will real- vire and associated coil, when subjected to :d levels of magnetic fields, can generate wer to actuate an external device. rnative embodiment illustrated in FIG. 3, 54 is mounted on an adjusting bracket gen- ıated by the reference numeral 100 that ıstener 102 that can be threaded into the defined in the lower housing portion 38 to ition of the module 54 relative to the mag- ıy varying the sensitivity of the switch 10.

As indicated in the above description, the switch 10 of the present invention is sensitive to pressure pulses for rather small fluid pressure change. Switch operation is provided from small "pulses" in air pressure in accordance with the preferred procedure, while not requiring a constant or steady pressure to maintain the switch in the actuated position. In addition, the diaphragm 42 orifices 48 and 50 and the sensitivity of the switch 10 is such that temperature changes experienced by the switch 10 will not produce rapid enough pressure changes to result in actuation of the switch 10.

Although two embodiments of the present invention have been shown, it will be understood that various changes and modifications may occur to those skilled in the art and it is contemplated by the appended claims to cover all such changes and modification as are within the true spirit and scope of the present invention.

What is claimed as new and desired to be secured by Letters Patent of the United States is:

1. A contactless pressure switch sensitive to fluid pressure rates of change comprising;
   a switch housing;
   a diaphragm mounted in said housing and defining first and second chambers;
   input means for communicating one of said first and second chambers with a source of fluid pressure;
   a magnet secured to said diaphragm;
   a switching module mounted within the other of said first and second chambers, spaced from said diaphragm and generating an electrical current pulse in the presence of a magnetic field of predetermined intensity;
   a biasing magnet secured to said switch module, and first and second ports defined in said first and second chambers respectively, said ports communicating with the atmosphere;
   wherein fluid pressure on said diaphragm repositions said magnet, thereby generating a current pulse indicative of said pressure.

2. The switch claimed in claim 1 wherein said switching module comprises a Wiegand module including a magnetic wire and a sensing coil wrapped therearound.

3. The switch claimed in claim 1 further comprising first and second terminals mounted on said housing and coupled to said switching module.

4. The switch claimed in claim 1 further comprising sensitivity adjustment means for adjusting the position of said switching module relative to said diaphragm.

5. A contactless switch actuated by fluid pressure rates of change comprising
   a housing defined by upper and lower housing portions,
   said upper and lower housing portions being ported to the atmosphere,
   said upper housing being in fluid communication with a source of fluid pressure,
   a diaphragm mounted between said upper and lower housing portions to define first and second chambers in said housing, said first and second chambers being in communication with the atmosphere by said ported upper and lower housing portions,
   a first magnet secured to said diaphragm,
   a signal module that generates an electrical current pulse that is switched by the field of said magnet secured to said housing,
   a second magnet secured to said signal module, said second magnet being of a lesser strength than said first magnet, and means for varying the position of said signal module relative to said diaphragm.

6. The switch set forth in claim 5 further comprising means for varying the position of said signal module relative to said diaphragm.

7. The combination comprising a door including a sensitive edge, said sensitive edge including a resilient, deformable body defining an interior fluid filled chamber, a communicating conduit extending from said chamber, a switch for recycling said door in fluid communication with said conduit, said switch including a housing defined by upper and lower housing portions, a diaphragm mounted in said housing defining first and second chambers in said housing, said first and second chambers being ported to the atmosphere, a first magnet secured to said diaphragm, a switching module generating an electrical current pulse actuated by the flux of said first magnet secured in said housing, a second magnet mounted adjacent said module, said second magnet is of a lesser strength than said first magnet.

8. The combination claimed in claim 7 wherein said module is of the Wiegand type.

* * * * *